US009290377B2

(12) United States Patent  
Cachia et al.

(10) Patent No.: US 9,290,377 B2  
(45) Date of Patent: Mar. 22, 2016

(54) METHOD OF STACKING A PLURALITY OF DIES TO FORM A STACKED SEMICONDUCTOR DEVICE, AND STACKED SEMICONDUCTOR DEVICE

(71) Applicant: STMicroelectronics (Malta) Ltd, Kirkop (MT)

(72) Inventors: Conrad Cachia, Tarxien (MT); Kenneth Fonk, San Gwann (MT)

(73) Assignee: STMicroelectronics (Malta) Ltd, Kirkop (MT)

( * ) Notice: Subject to any disclaimer, the term of this patent is extended or adjusted under 35 U.S.C. 154(b) by 0 days.

(21) Appl. No.: 14/554,473

(22) Filed: Nov. 26, 2014

(65) Prior Publication Data

US 2015/0145077 A1 May 28, 2015

(30) Foreign Application Priority Data

Nov. 28, 2013 (IT) .............................. TO2013A0967

(51) Int. Cl.  
*H01L 21/00* (2006.01)  
*B81B 7/00* (2006.01)  
(Continued)

(52) U.S. Cl.  
CPC ............. *B81B 7/0074* (2013.01); *B81C 1/0023* (2013.01); *B81C 3/001* (2013.01); *H01L 21/6836* (2013.01); *H01L 24/06* (2013.01); *H01L 24/27* (2013.01); *H01L 24/29* (2013.01); *H01L 24/73* (2013.01); *H01L 24/83* (2013.01); *H01L 24/92* (2013.01); *H01L 24/97* (2013.01);  
(Continued)

(58) Field of Classification Search  
CPC ....... H01L 23/053; H01L 24/06; H01L 24/27; H01L 24/29; H01L 24/73; H01L 24/83; H01L 24/92; H01L 24/97

USPC .................................... 438/48, 50, 51, 57, 64  
See application file for complete search history.

(56) References Cited

U.S. PATENT DOCUMENTS

2003/0162324 A1   8/2003   Tomimatsu  
2006/0124230 A1   6/2006   Chartier et al.  
(Continued)

FOREIGN PATENT DOCUMENTS

| DE | 10 2009 000 352 A1 | 7/2010 |
| JP | 2000-71422 A | 3/2000 |
| JP | 2005-14141 A | 10/2005 |

OTHER PUBLICATIONS

"Adhesive bonding" Wikipedia, retrieved from http://en.wikipedia.org/w/index.php?title=Adhesive_bonding&old . . . on Aug. 25, 2014, 10 pages.

(Continued)

*Primary Examiner* — Hung Vu  
(74) *Attorney, Agent, or Firm* — Seed Intellectual Property Law Group PLLC

(57) ABSTRACT

A method of stacking a plurality of first dies to a respective plurality of second dies, each one of the first dies having a surface including a surface coupling region which is substantially flat, each one of the second dies having a respective surface including a respective surface coupling region which is substantially flat, the method comprising the steps of: forming, by means of a screen printing technique, an adhesive layer on the first dies at the respective surface coupling regions; and arranging the surface coupling region of each second die in direct physical contact with a respective adhesive layer of a respective first die among said plurality of first dies.

12 Claims, 8 Drawing Sheets

(51) Int. Cl.
   *B81C 1/00* (2006.01)
   *B81C 3/00* (2006.01)
   *H01L 21/683* (2006.01)
   *H01L 25/065* (2006.01)
   *H01L 25/00* (2006.01)
   *H01L 23/00* (2006.01)

(52) U.S. Cl.
   CPC ............ *H01L 25/0657* (2013.01); *H01L 25/50* (2013.01); *H01L 24/05* (2013.01); *H01L 24/32* (2013.01); *H01L 24/33* (2013.01); *H01L 24/48* (2013.01); *H01L 24/85* (2013.01); *H01L 2221/68331* (2013.01); *H01L 2224/04026* (2013.01); *H01L 2224/04042* (2013.01); *H01L 2224/05624* (2013.01); *H01L 2224/05638* (2013.01); *H01L 2224/05644* (2013.01); *H01L 2224/05647* (2013.01); *H01L 2224/0603* (2013.01); *H01L 2224/27005* (2013.01); *H01L 2224/2732* (2013.01); *H01L 2224/27334* (2013.01); *H01L 2224/27848* (2013.01); *H01L 2224/2919* (2013.01); *H01L 2224/32145* (2013.01); *H01L 2224/32225* (2013.01); *H01L 2224/33181* (2013.01); *H01L 2224/48091* (2013.01); *H01L 2224/48105* (2013.01); *H01L 2224/48229* (2013.01); *H01L 2224/73215* (2013.01); *H01L 2224/73265* (2013.01); *H01L 2224/83191* (2013.01); *H01L 2224/83211* (2013.01); *H01L 2224/83856* (2013.01); *H01L 2224/83862* (2013.01); *H01L 2224/92* (2013.01); *H01L 2224/92147* (2013.01); *H01L 2224/92247* (2013.01); *H01L 2224/97* (2013.01); *H01L 2225/0651* (2013.01); *H01L 2924/10157* (2013.01); *H01L 2924/12042* (2013.01); *H01L 2924/1461* (2013.01); *H01L 2924/15192* (2013.01); *H01L 2924/161* (2013.01)

(56) References Cited

U.S. PATENT DOCUMENTS

| | | | |
|---|---|---|---|
| 2008/0136045 A1* | 6/2008 | Tan et al. | 257/777 |
| 2009/0026632 A1* | 1/2009 | Shen et al. | 257/777 |
| 2013/0082258 A1 | 4/2013 | Azzopardi et al. | |

OTHER PUBLICATIONS

Baumgartner et al., "A 3-D packaging concept for cost effective packaging of MEMS and ASIC on wafer level," IEEE European Microelectronics and Packaging Conference, Jun. 15, 2009, 5 pages.

Sutanto et al. ,"Development of Chip-on-Chip with Face to Face Technology as a Low Cost Alternative for 3D Packaging," IEEE Electronic Components & Technology Conference, pp. 955-965, 2013.

* cited by examiner

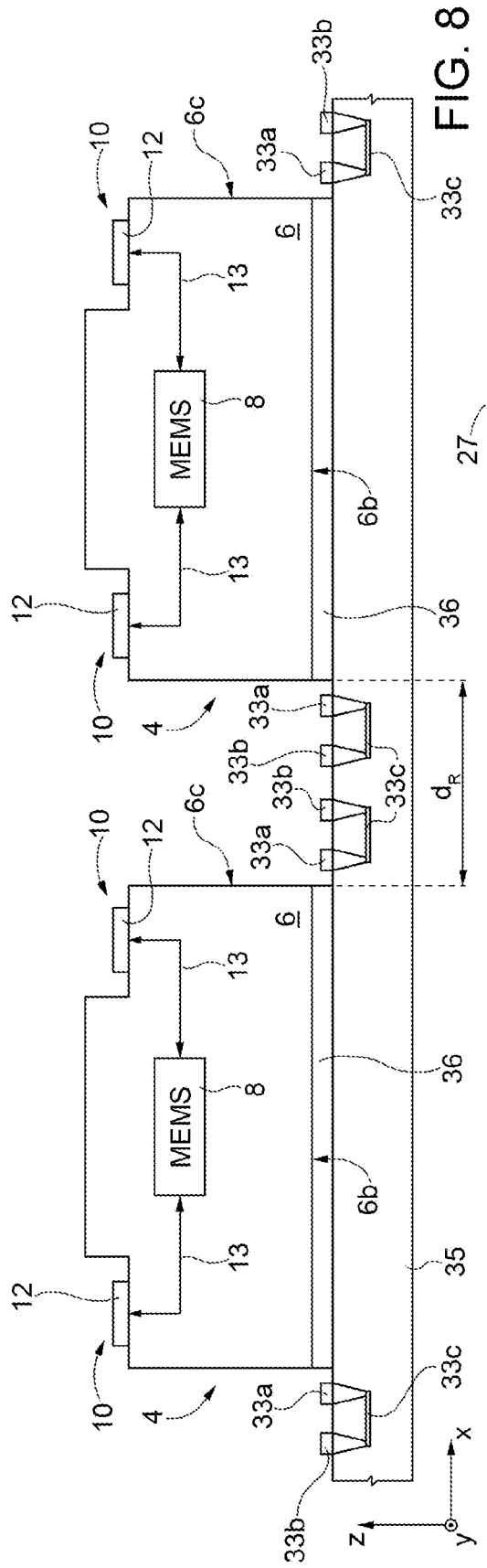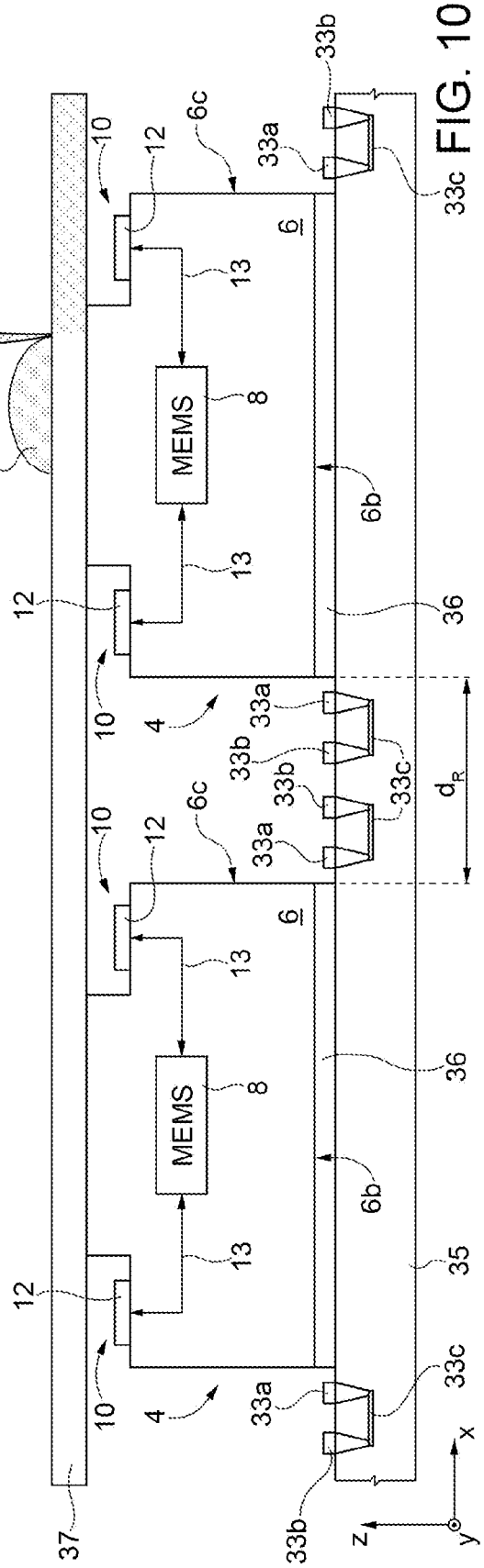

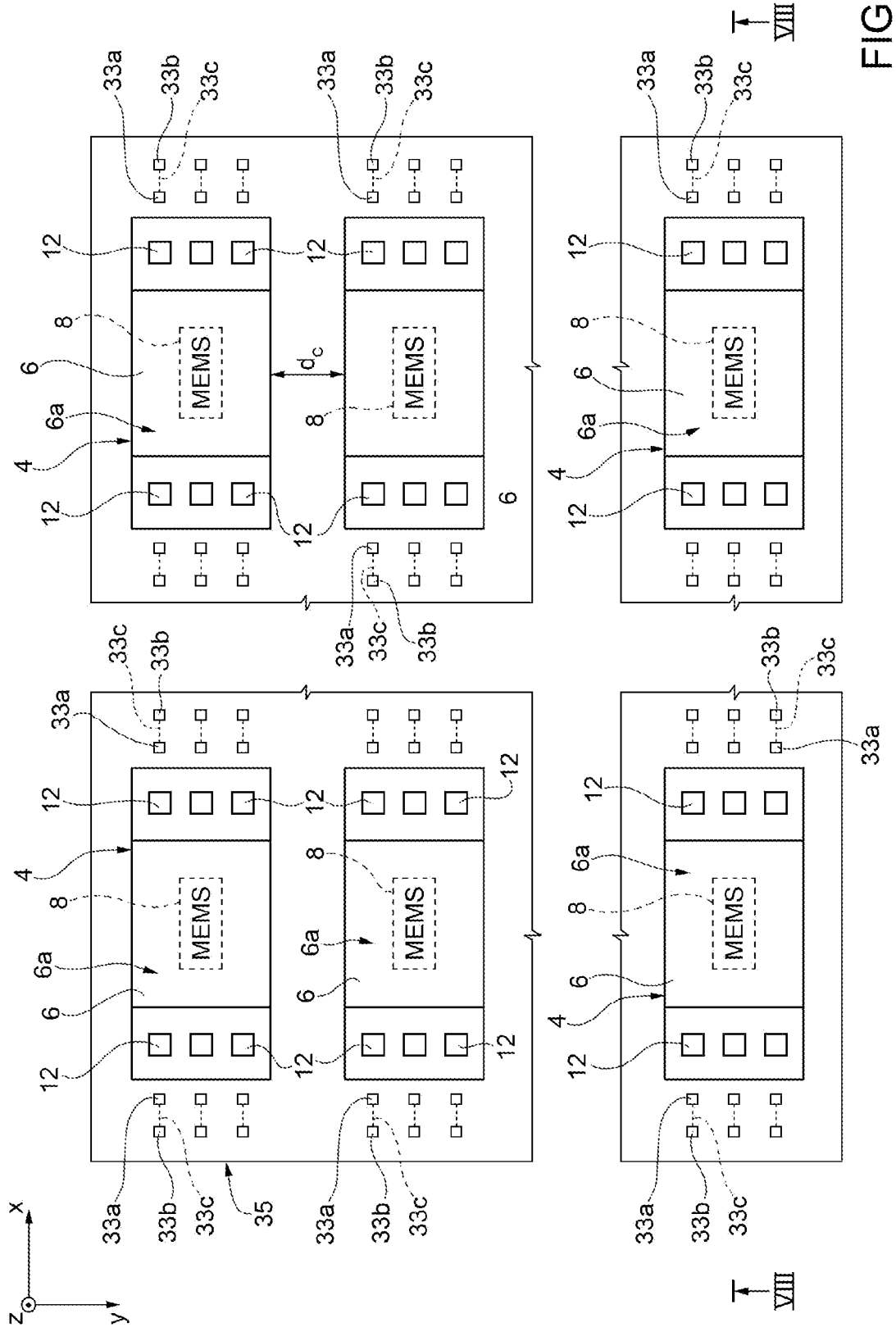

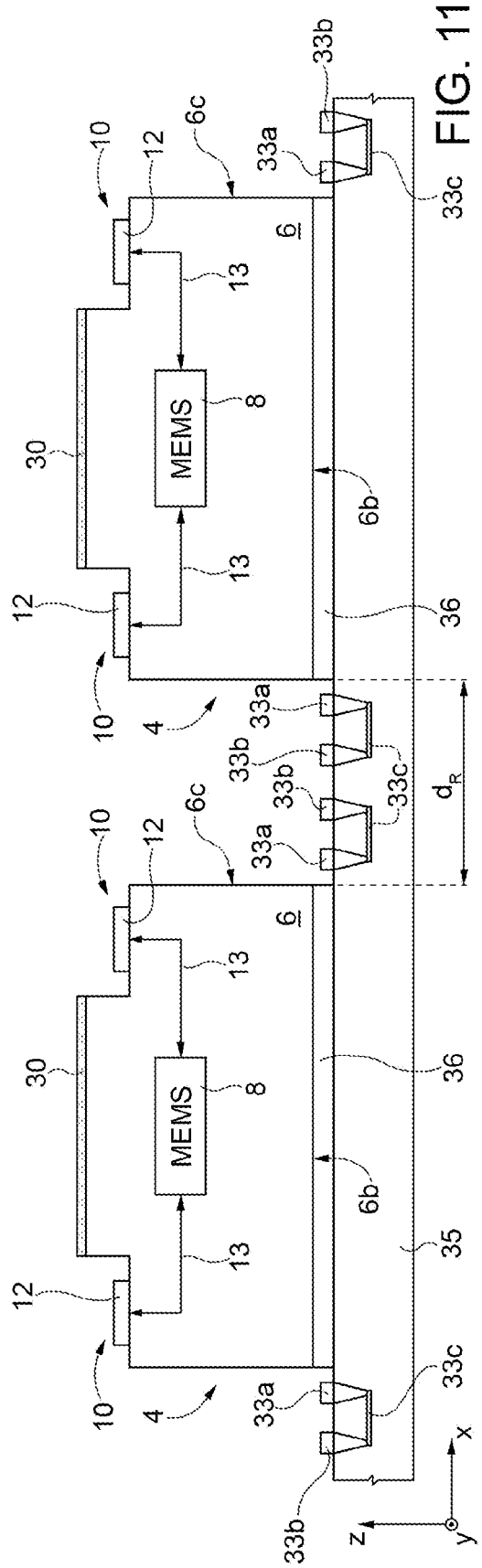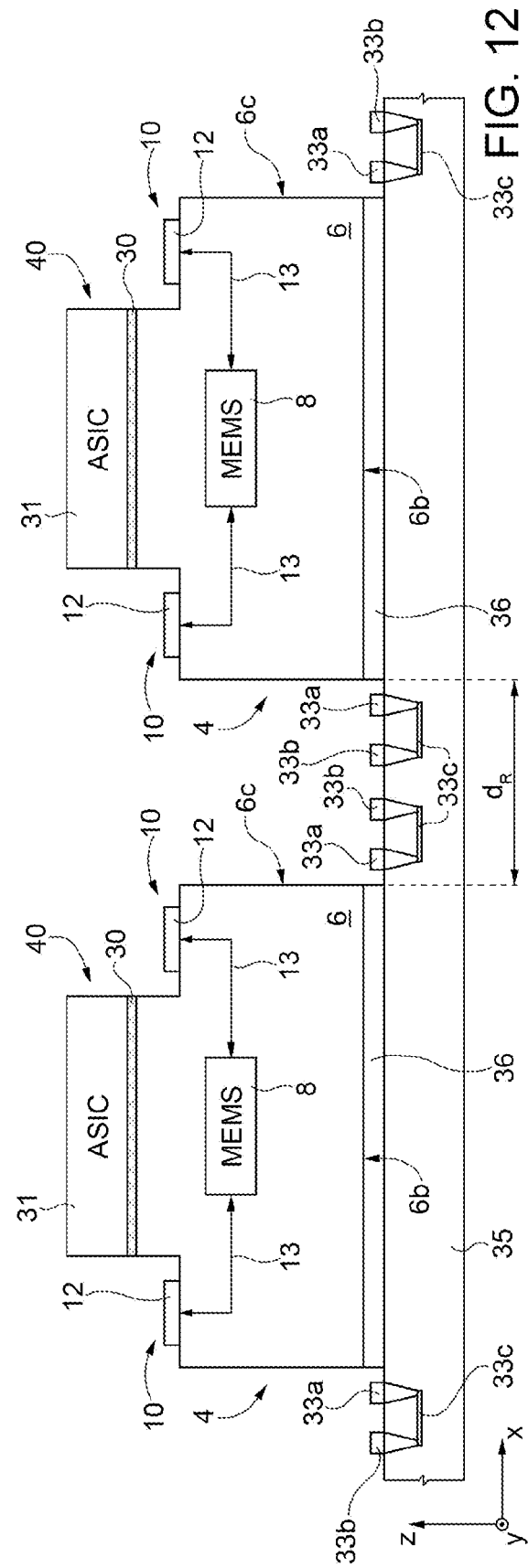

METHOD OF STACKING A PLURALITY OF DIES TO FORM A STACKED SEMICONDUCTOR DEVICE, AND STACKED SEMICONDUCTOR DEVICE

BACKGROUND

1. Technical Field

The present disclosure relates to a method of stacking a plurality of dies to form a stacked semiconductor device or system, and to the stacked semiconductor device or system.

2. Description of the Related Art

Currently assembly of a plurality of dies, where one of them has a thickness equal to, or lower than, 50 µm, includes a specific technique in order not to damage the thin die and allow die attach film (DAF) tape separation. Due to the wafer sawing process, such a thin wafer is singulated by means of a "Dicing Before Grinding" (DBG) process. This leaves singulated dies face down on a grinding tape. The same dies, then, are further laminated onto either a mounting tape or onto a DAF tape and a mounting tape to be processed at die attach.

In case of using a mounting tape only, a DAF tape is pre-applied, with a tape cut-and-place process, to the thicker die. The same process is not easily adaptable to the thinner die.

In the case where the singulated die is laminated onto a DAF tape, the latter is in some way separated at the sawing kerfs. Two methods available are either laser DAF cutting or low temperature expansion of the DAF tape which causes a rupture of the DAF tape along the existing kerf lines.

The process of tape cut-and-place utilizes additional hardware options on the die attach machines and is limited in application to large dies, due to economic reasons and availability of tape reels of the required width, as well as the manipulation of reduced tape sizes.

The method of DAF laser cutting is applicable to any die size. The limitations of this method are mainly due to high costs and low process throughput.

The method of DAF expansion at low temperatures utilizes dedicated equipment. To date this method is limited to large die sizes and is not applicable to die sizes less than 3×3 mm. Moreover the process is not isotropic and the DAF tape breakages are inconsistent across the wafer axes.

There is an ever present need to reduce package dimensions particularly the package height by the consumer market. Die thickness reduction is a critical element to achieve. A grinding process to achieve thin dies as far as 20 µm is available. Accordingly, there is a desire for achieving a cost effective way to perform die attach for such thin dies. In particular, there is a desire to achieve a cost effective and reliable method to stack a thin die on top of a MEMS sensor.

BRIEF SUMMARY

One or more embodiments of the present disclosure is to provide a method of stacking a plurality of dies to form a stacked semiconductor device, and a stacked semiconductor device. One embodiment or more embodiments may achieve a cost effective and reliable method to stack a thin ASIC die (e.g., 50 µm or less) on top of a MEMS sensor.

One embodiment is directed to a method of stacking a plurality of first dies to a respective plurality of second dies. Each one of the first dies has a first surface coupling region that is substantially flat, and each one of the second dies having a second surface coupling region that is substantially flat. The method includes forming, using a screen printing technique, an adhesive layer on the first dies at the first surface coupling regions. The method further includes arranging the second surface coupling region of each second die in direct physical contact with a respective adhesive layer of a respective first die among said plurality of first dies.

BRIEF DESCRIPTION OF THE SEVERAL VIEWS OF THE DRAWINGS

For a better understanding of the disclosure, preferred embodiments thereof are now described, purely by way of non-limiting example and with reference to the annexed drawings, wherein:

FIGS. 8-14 shows manufacturing steps carried out on a plurality of devices of the type shown in FIG. 1, according to a further embodiment of the present disclosure.

DETAILED DESCRIPTION

Figure 1:
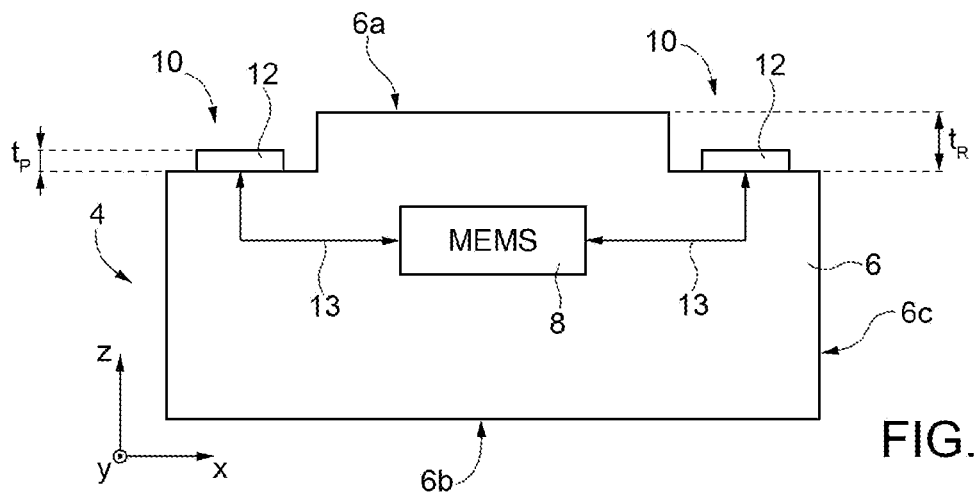
FIG. 1 shows a cross lateral section of a device housing a MEMS structure, according to a known embodiment.
Figure 2:
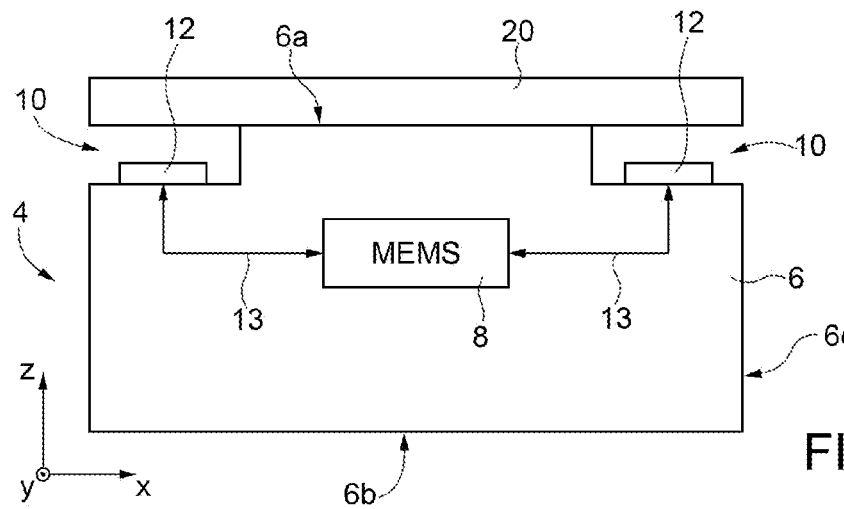
FIG. 2 shows the device of FIG. 1 coupled to a screen mask for screen printing, according to a manufacturing step according to an embodiment of the present disclosure.

Referring to FIG. 1, a device 4 includes a substrate 6, for example of semiconductor material, in particular silicon or germanium, having a top surface 6a opposed, along a direction Z, to a bottom surface 6b. The top surface 6a does not have bumps or protrusions or exposed active parts. As better explained later on, the top surface 6a may have instead one or more recesses. With the exception of the recesses, thus, the top surface 6a is flat or substantially flat. In this context, a surface flat or substantially flat means a surface having a roughness of some tens of nanometers, e.g., in the range 10-100 nm, typically 65 nm.

The device 4 includes a MEMS structure 8 integrated in the substrate 6. Accordingly, in the following description, the device 4 is also referred to as MEMS device 4. Furthermore, the device 4 may also include a further MEMS structure and/or an integrated circuit (not shown). The substrate 6 may also include any plurality of layers formed thereon such as epitaxial layer(s), insulating layer(s), dielectric layer(s), conductive layer(s), and/or other suitable materials.

The MEMS structure 8 includes, according to an embodiment, elements forming a motion sensor (e.g., an inertial sensor such as a gyroscope or an accelerometer, an oscillator, and/or any other MEMS device which does includes elements exposed over the top surface 6a). In this way, the MEMS structure 8 is effectively integrated within the substrate 6 and does not perturb the substantial flatness of the top surface 6a.

As said, the MEMS device 4 further includes one or more recesses 10 (two recesses are shown in FIG. 1), formed in the device substrate 6. The recesses 10 are formed at the top surface 6a, at peripheral regions of the MEMS device 4. The recesses 10 may be formed by a sequence of photolithographic and etching processes which are per se known, including wet etch and/or dry etching. The position, dimension and shape of the recesses 10 may be determined by the layout design for the MEMS device 4. The recesses 10 house respective electrical connecting elements 12, in particular bond pads 12 which form bonding sites for the MEMS device 4. In other words, the bond pads 12 are electrical conductive elements that provide for I/O electrical interconnections to a further substrate (e.g., substrate of a package) and/or device.

According to an embodiment, recesses 10 have a depth $t_R$, measured along the Z direction starting from the top surface 6a, of at least 100 µm, for example equal to approximately 130 µm.

The bond pad 12 housed by each recess 10 is made, for example, of metal such as aluminum, copper, gold, or any other suitable conductive materials different from metals, e.g., doped polysilicon. According to an embodiment, each bond pad 12 has a thickness $t_P$, measured along the Z direction, in the range of about 0.8 µm-1 µm. The bond pad 12 may be an I/O bond pad providing connection to one or more elements or features integrated within the substrate 6 (e.g., the MEMS structure 8 and/or an integrated circuit), as shown in FIG. 1 by means of arrows 13. Furthermore, the bond pad 12 may be connected to a multi-level interconnect including a plurality of conductive lines and vias formed through the substrate 6 (not shown).

According to an aspect of the present disclosure, an adhesive layer, in particular a paste layer, is applied on the top surface 6a of the substrate 6 but not within the recesses 10. In this way, the top surface 6a effectively forms an interface for stacking a further die without compromising the electrical properties of the bond pads 12 in the recesses 10. In particular, the paste used to form the paste layer is a B-stageable paste, more in particular a B-stageable epoxy resin, which is known in the art. According to an embodiment, the paste used is ABLECOAT® 8006NS. The term "B-staged", or "B-stage", or "B-stageable", in reference to an epoxy resin, is commonly used to identify a single component epoxy system, using a latent, or low reactivity, curing agent. This product can be partially cured, as an initial stage, after being applied onto one substrate/surface. It can, at a later time, be completely cured with a heat treatment.

Other pastes can be used, such as generally known die attach adhesives, or screen-printable adhesive with glue fillet control properties.

According to an embodiment of the present disclosure, after providing the MEMS device 4 of FIG. 1 (or any other device having a substantially flat top surface), a screen mask 20, adapted for screen printing, is disposed over the top surface 6a of the substrate 6.

Figure 3:
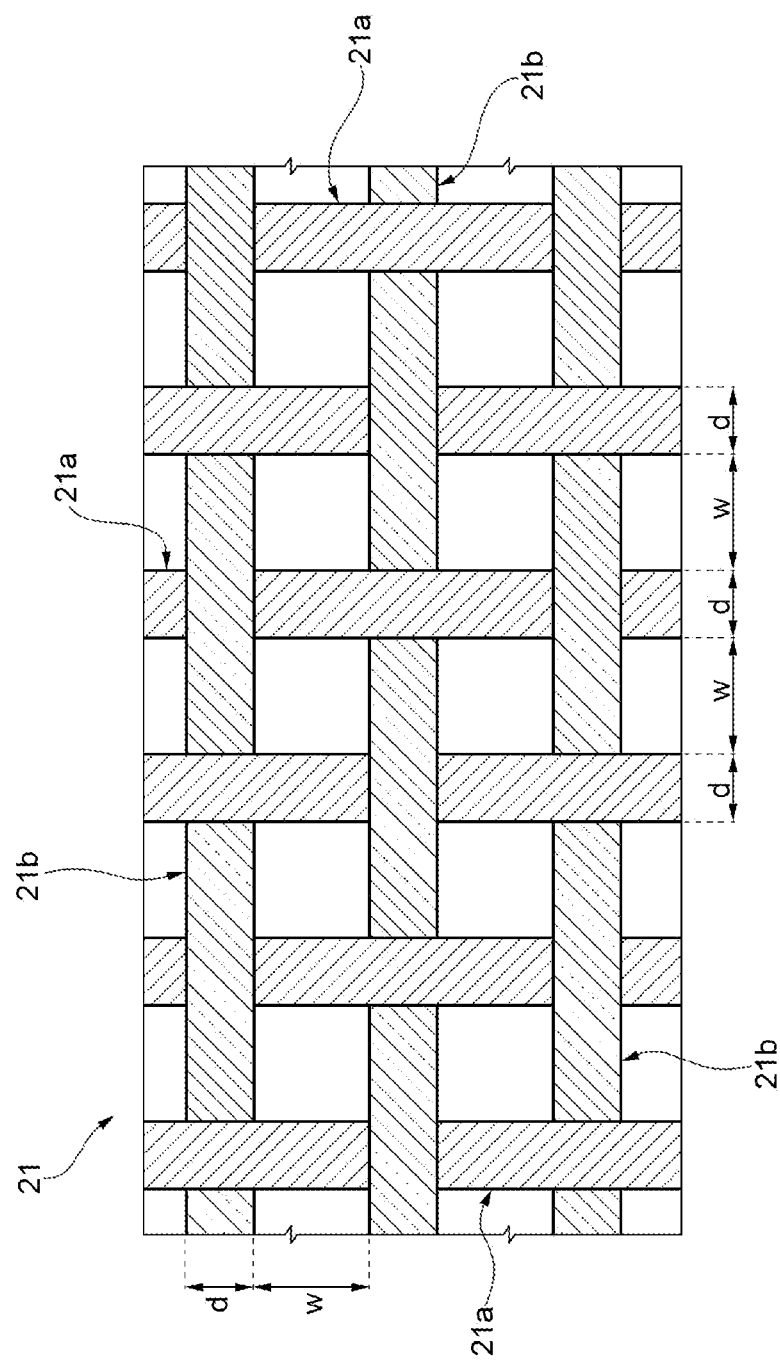
FIG. 3 shows a screen mask which can be used during the manufacturing step of FIG. 2.

A portion of the mesh structure 21 of the screen mask 20 is shown, by way of example, in FIG. 3. The mesh structure 21 comprises a plurality of stainless steel wires 21a extending parallel to one another and a plurality of stainless steel wires 21b extending parallel to one another and orthogonal to the stainless steel wires 21a.

With reference to FIG. 3, the mesh count w and the wire diameter d is the same for stainless steel wires 21a and 21b. In particular, mesh count w refers to the number of wires per inch contained in the mesh structure 21; the wire diameter d refers to the diameter of each wire 21a, 21b which has been woven into the mesh structure 21. According to an embodiment of the present disclosure, mesh count w is equal to 63 wires/inch, and the wire diameter d is equal to 36 µm. Accordingly, the mesh structure 21 has an open area $A_O$ (total open area in terms of mesh apertures across the entire surface of the mesh structure 21) of about 40%. Alternatively, mesh structures having different open area $A_O$ may be used.

Figure 4:
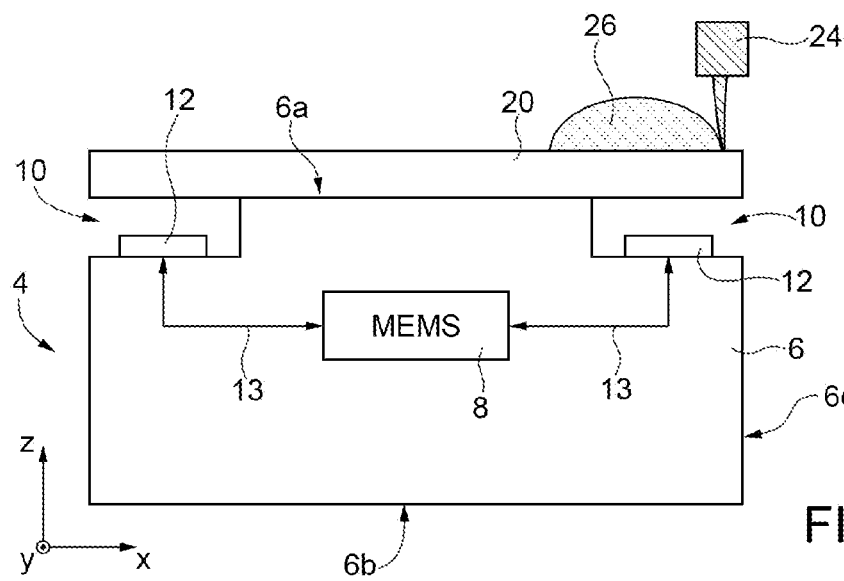
FIGS. 4-7 shows further manufacturing step carried out on the device of FIG. 1, according to an embodiment of the present disclosure.

Referring to FIG. 4, a screen-printing type paste 26, e.g., a B-stageable non-conductive epoxy resin, is set on the screen mask 20, and a screen printing step is carried out. The screen printing step is carried out as it is commonly known in the art, i.e., by means of a squeegee 24 which is, for example, a flat, smooth rubber blade. Metal squeegees may be used instead.

A fine alignment between the screen mask 20 and the regions over which the paste 26 is to be deposited may be eliminated. In particular, when the entire top surface 6a has to be covered with an adhesive paste layer, a screen mask 20 covering the entire top surface 6a, or even extending out of the borders of the top surface 6a, may be used. Furthermore, as the screen mask 20 shows uniformly distributed apertures, no fine alignment is needed. Accordingly, the screen mask 20 completely overlaps the top surface 6a and the recesses 10.

Figure 5:
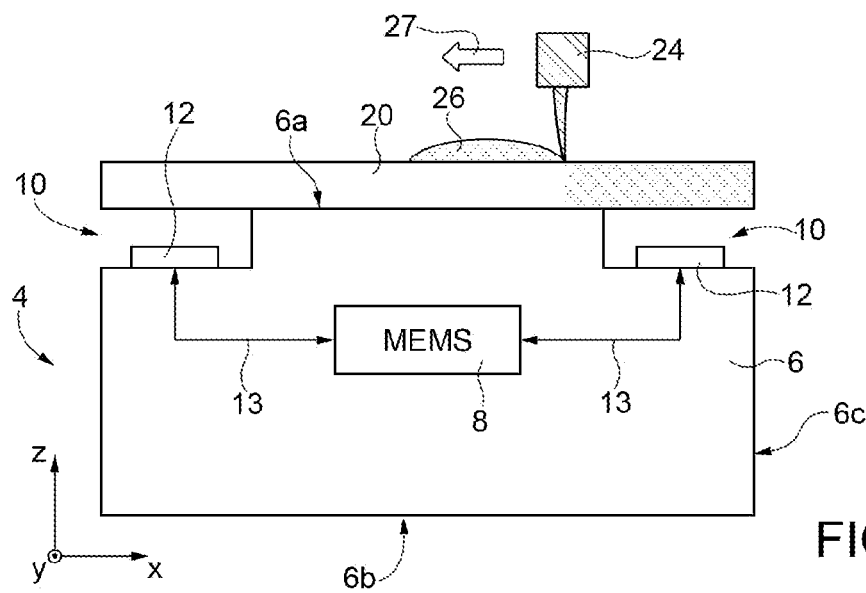

In greater detail, after the paste 26 is deposited on the screen mask 20, the squeegee 24 is disposed onto the screen mask 20, and moved onto the screen mask 20, to print the paste 26. This is schematically shown in FIG. 5 by means of arrow 27. During this printing step, the squeegee 24 moves and presses the paste 26 with an appropriate pressure in order to allow the paste 26 to pass through the apertures of the screen mask 20, thus reaching, and adhering to, the top surface 6a of the substrate 6. The Applicant has noted that, in the regions where the screen mask 20 is not in direct contact with the top surface 6a during printing (i.e., at the recesses 10), the paste 26 does not leak out of the screen mask 20 and, accordingly, no paste flows, or is deposited, within the recesses 10.

Figure 6:
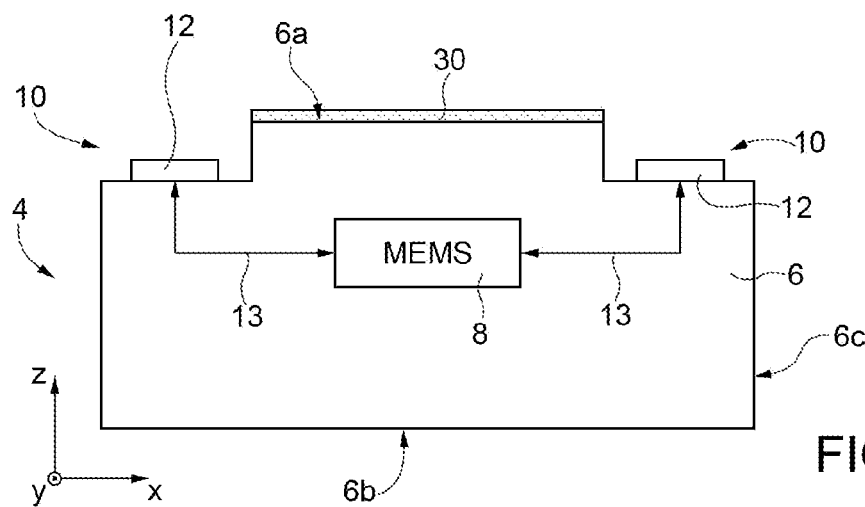

Referring to FIG. 6, the screen mask 20 is separated from the device 4, leaving a paste layer 30 on the top surface 6a. The paste layer 30 extends at regions of the top surface 6a corresponding to regions previously covered by the screen mask 20 and which came into direct contact with the paste 26 during the step of FIG. 5; accordingly, the paste layer 30 extends around the recesses 10 but not within the recesses 10. Moreover, even if the screen mask 20 exceeds the maximum dimensions of the device 4 along X and Y directions, paste 26 is not present around the device 4 (other than the stop surface 6a) or along lateral walls 6c of the device 4.

After formation of paste layer 30, a first thermal process is carried out, to partially cure the B-stageable paste 26. The thermal process comprises placing the device 4 in a oven, rising the temperature to about 100° C. with a temperature ramp of about 30 minutes, and continuing the curing step at a fixed temperature of about 100° C. for about 60 minutes. Other thermal treatments are available, according to specific paste used.

Figure 7:
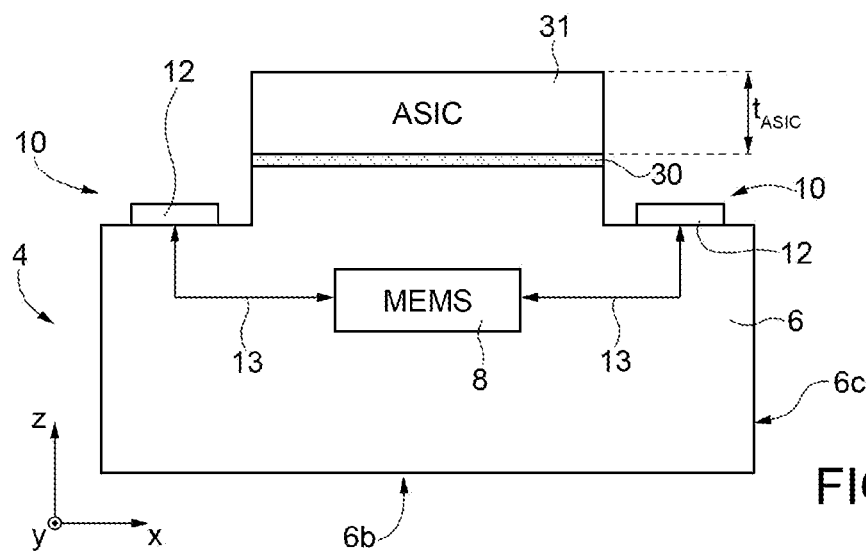

Referring to FIG. 7, a step of die attach is carried out. This step is carried out according to a standard die-attach technique. A die 31 is, according to an embodiment, a die housing an ASIC circuit, which has already been processed under DBG ("Dice Before Grinding") process, to achieve a thickness $t_{ASIC}$ equal to, or below, 50 µm (e.g., in the range 20-50 µm). The ASIC die 31, after manufacturing process for forming ASIC circuitry and after grinding, is placed over the top surface 6a of the substrate 6 of the MEMS device 4, in direct contact with the paste layer 30. The paste layer 30 thus forms an interface between the thin ASIC die 31 and the MEMS device 4, guarantying adhesion among them.

The maximum adhesion is achieved by a further step of thermal process to cure the B-stageable paste forming a fully-cured paste layer 30. This thermal process comprises placing the MEMS device 4 with ASIC die 31 attached in an oven, rising the temperature to about 170° C. with a temperature ramp of about 30 minutes, and continuing the curing step at a fixed temperature of about 170° C. for about 60 minutes.

The above described process can be applied to a plurality of MEMS devices 4, in a mass production facility.

FIG. 8 shows, in lateral view, the support substrate 35 over which a plurality of MEMS devices 4 of the type shown in FIG. 1 are attached. Each MEMS device 4 is coupled to the support substrate 35 through an adhesive layer 36 which is, for example, a layer of adhesive paste, or die attach film. The support substrate 35 is, more in particular, a standard organic substrate, in particular an organic FR-4 substrate.

According to an embodiment, the arrangement of the plurality of MEMS devices 4 over the support substrate 35 is an initial step for carrying out a packaging operation of the plurality of MEMS devices 4, and is made according to the known art. According to this embodiment, the support substrate 35 moreover comprises a plurality of conductive (e.g., metal) pads, arranged around each MEMS device 4, providing electrical connections for the bonding pads 12. The conductive pads may include pads 33a which, after packaging, remains internal to the package, configured to be electrically connected (e.g., through wire bonding) to the pads 12; and pads 33b which, after packaging, remains external to the package, configured to form an electrical interface to access the bonding pads 12 of the respective MEMS device 4. Pads 33a and 33b are connected to one another through a conductive path 33c which may be formed integrated in the support substrate 35.

FIG. 9 is a top view of the support substrate 35 housing the plurality of MEMS devices 4 according to FIG. 8. FIG. 8 is a cross section of FIG. 9 taken along cut line VIII-VIII.

The plurality of MEMS devices 4 is arranged in a matrix form over the support substrate 35, and are aligned along rows (parallel to X direction) and columns (parallel to Y direction). Each device 4 is separated, from an immediately successive device 4 arranged along a same row, by a distance $d_R$ equal to about 0.25 mm. However, the distance $d_R$ may vary and may be in the range of 0.18-0.4 mm. Analogously, each device 4 is separated, from an immediately successive device 4 arranged along a same column, of a distance $d_C$ equal to about 0.25 mm. However, the distance $d_C$ may vary and may be in the range of 0.18-0.4 mm.

Referring to FIG. 10, a screen mask 37 is arranged over the plurality of MEMS devices 4, in such a way that the screen mask 37 is in direct contact with the top surfaces 6a of each MEMS device 4. Alternatively, at this step, the screen mask 37 does not need to be in direct contact with the top surfaces 6a of each MEMS device 4, but it is adapted to contact directly the top surfaces 6a of each device 4 during a subsequent screen printing step.

The screen mask 37 is analogous to the screen mask 20 previously described with reference to, in particular to FIG. 3. In this case, the screen mask 37 is shaped in such a way to completely overlap the plurality of MEMS devices 4 when placed in position according to FIG. 10 (e.g., the screen mask 37 has, in a top view, the same shape as the support substrate 35). Then steps analogous to the steps previously described with reference to FIGS. 4 and 5 are carried out. A paste 26 is deposited on the screen mask 37 and, by means of the squeegee 24, a portion of the paste 26 is transferred through the screen mask 37 to the top surfaces 6a of each MEMS device 4 where the screen mask 37 comes in direct contact with the top surfaces 6a of the MEMS devices 4.

Referring to FIG. 11, the screen mask 37 is removed and the paste layer 30 remains on the top surface 6a of each MEMS device 4.

According to an embodiment of the present disclosure, the apertures of the screen mask 37 are not covered or obstructed at the regions of the screen mask 37 which are aligned, when the screen mask 37 is set in position over the devices 4, with the spacing existing between MEMS devices 4. Accordingly, the screen mask 37 has a substantially uniform pattern over its entire extension.

As already said, the Applicant has noted that, where the screen mask 37 is not in direct contact with the top surface 6a of MEMS devices 4 (i.e., in the regions between MEMS devices 4), the paste 26 does not leak out of the screen mask 37 and, accordingly, no paste 26 flows through the mask screen 37 towards the support substrate 35 or between the top surfaces 6a of the MEMS devices 4.

After forming the paste layer 30, a step of die attach is carried out, as already disclosed with reference to FIG. 7. The die attach step is known in the art. Referring to FIG. 12, the die attach process is performed using a pick operation from a singulated wafer and a die attach operation to attach the die onto another surface are carried out. In this case, since the adhesive has already been deposited, the die to be attached (e.g., ASIC die) does not need any die attach film adhered to its back-side. In the case of a b-stage material, the heat block should be set at a temperature above a known temperature (in this case it was 100° C.) to change the b-stage material consistency from solid to a soft tacky substance for attachment. In the case of adhesive, the bond-site temperature during die attach should be maintained at room temperature (which, however, may vary depending on the material selected for the application).

Thus, a plurality of stacked dies 40 is formed, each of the stacked dies 40 including one MEMS device 4 and a respective ASIC die 31, coupled together by means of the paste layer 30.

A thermal process to fully cure the B-stageable paste, forming the fully-cured paste layer 30, is carried out for the plurality of stacked dies 40. A maximum adhesion is thus achieved. This thermal process comprises placing the support substrate 35 with the stacked dies 40 in an oven, rising the temperature to about 170° C. with a temperature ramp of about 30 minutes, and continuing the curing step at a fixed temperature of about 170° C. for about 60 minutes.

Figure 13:
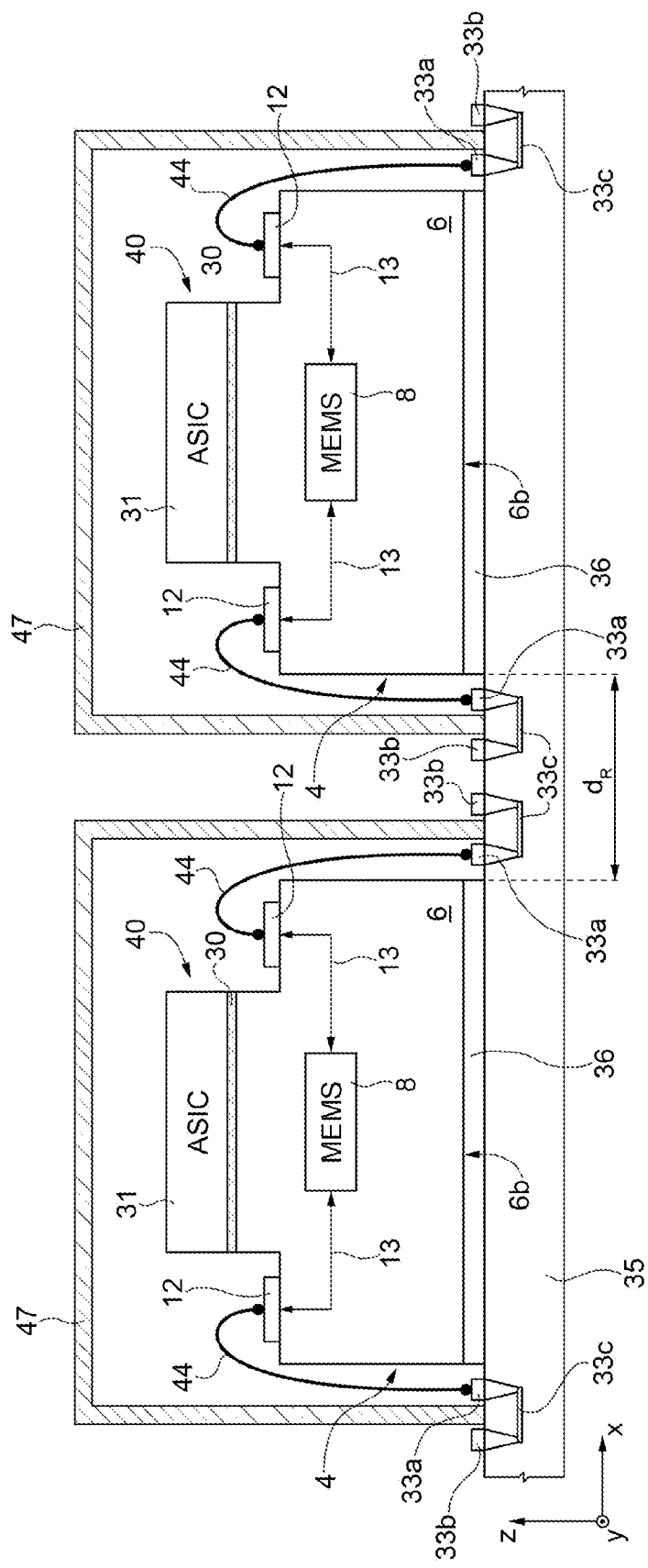

Referring to FIG. 13, a wire bonding step is carried out, connecting the bonds pad 12 of each MEMS device 4 to respective pads of the support substrate 35 through bonding wires 44.

A protective structure (or cap) 47 is then formed over and around each stacked die 40, thus completing the manufacturing process for forming a package 45.

Figure 14:
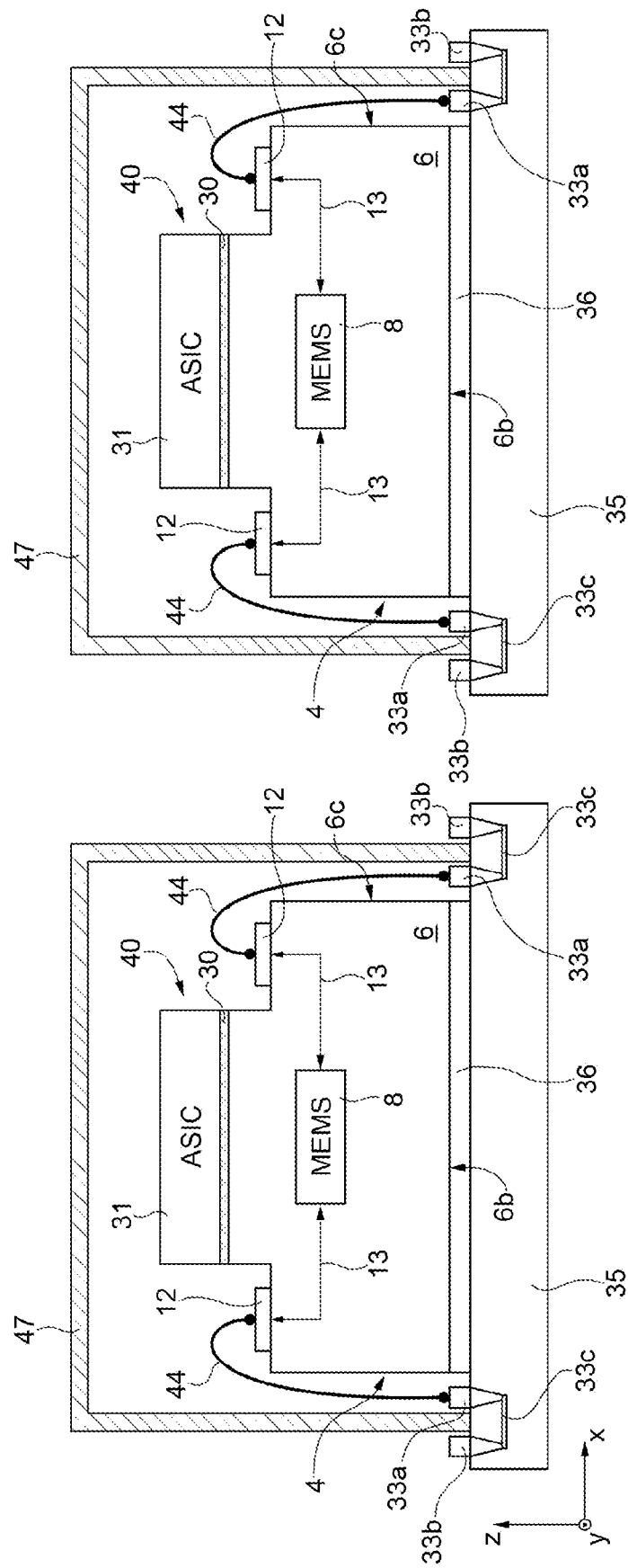

Referring to FIG. 14, packages 45 are singulated into individual units 49 ("dicing"). The dicing process can be accomplished by scribing and breaking, by mechanical sawing or by laser cutting. During dicing, the support substrate is typically mounted on a dicing tape.

It is noted that the steps described with reference to FIG. 13 (wire bonding and formation of the cap) may be carried out after the dicing process.

The device, or system, thus formed, comprising a first die (e.g., housing a MEMS sensor) coupled to a second die (e.g., housing an ASIC circuit), is adapted to carry out sensing operations to sense an external quantity, transduction of the sensed quantity, and signal elaboration. The device, or system, includes one among (but is not limited to) an inertial sensor, such as an accelerometer or a gyroscope, magnetometer, pressure sensor, humidity sensor and any kind of sensing device in an enclosed cavity with flat top.

From an examination of the characteristics provided according to the present disclosure, further advantages emerge clearly.

In particular, according to the present disclosure, the adhesive layer between the MEMS sensor and the thin ASIC die can be deposited in feasible and economically advantageous way. Moreover, all the required manufacturing steps for forming the adhesive layer are executed on the (thick) MEMS device. Furthermore, since according to the present disclosure there is no need to apply a DAF tape on the thin ASIC die, there is also no need for carrying out a DAF separation process after the ASIC dicing process.

Furthermore, process steps and the hardware used may be the same irrespective of the size and shape of the MEMS devices, and irrespective of the particular layout of the top surface of the MEMS device (provided that no protrusions exists on the top surface of the MEMS device).

The use of a B-stageable paste allows a cost reduction with respect to a DAF tape.

Finally, it is clear that modifications and variations may be made to the embodiments described and illustrated herein, without thereby departing from the scope of protection of the present disclosure.

In particular, even if the method according to the present disclosure has been disclosed and illustrated with explicit reference to the steps required for stacking two dies, it can be employed to stack any number of dies one over the other. In this case, each die is physically coupled to another die through an adhesive paste layer formed by means of screen printing technique, as described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
    stacking a plurality of first dies with a plurality of second dies, respectively, each one of the first dies having a first surface coupling region that is substantially flat, each one of the second dies having a second surface coupling region that is substantially flat, the stacking including:
    attaching said plurality of first dies on a support substrate in a spaced apart arrangement with spacings between neighboring first dies;
    arranging a screen mask on said plurality of first dies, the screen mask overlapping said first surface coupling regions of the first dies and said spacings between neighboring first dies, the screen mask having a plurality of uniformly distributed apertures,
    forming, using a screen printing technique, an adhesive layer at each of the first surface coupling regions of the first dice, by:
        dispensing an adhesive paste on the screen mask; and
        moving and pressing said adhesive paste on the screen mask causing the adhesive paste to pass through the apertures of the screen mask until the adhesive paste comes in direct contact with the respective first surface coupling regions of the plurality of first dies; and
    arranging the second surface coupling region of each second die in direct physical contact with a respective adhesive layer of the plurality of adhesive layers respectively, on said first dies.

2. The method according to claim 1, wherein at least one of the first dies has a recess proximate the first surface coupling region, wherein arranging the screen mask on said plurality of first dies comprises arranging the screen mask so that the screen mask overlaps said recess.

3. The method according to claim 1, wherein said screen mask comprises a mesh structure made of stainless steel wires.

4. The method according to claim 1, wherein the support substrate is an organic substrate configured to form a support base of a package, the method further comprising placing a cap over the support substrate covering and protecting the first and second dies.

5. The method according to claim 1, wherein each one of the first dies houses an integrated MEMS structure of a motion sensor, and each one of the second dies houses an integrated ASIC circuit.

6. The method according to claim 1, wherein each one of the second dies has a maximum thickness, measured along a direction orthogonal to said second surface coupling region of the respective second die, in a range between 20-50 μm.

7. The method according to claim 1, wherein forming, using the screen printing technique, the adhesive layer comprises forming an epoxy-based B-stageable paste layer using the screen printing technique.

8. A method comprising:
    placing a screen mask on surfaces of a plurality of semiconductor dies, each of the semiconductor die includes a raised portion and a recessed portion, wherein placing the screen mask on the surfaces comprises placing the screen mask directly on a surface of the raised portion without touching a surface of the recessed portion;
    dispensing a paste on the screen mask;
    causing the paste to pass through apertures of the screen mask that are located over the raised portion, without causing the paste to pass through apertures of the screen mask that are located over the recessed portion; and
    removing the screen mask, wherein a layer of paste remains on the surface of the raised portion of the semiconductor dies when the screen mask is removed.

9. The method according to claim 8, wherein the paste is an epoxy resin.

10. The method according to claim 8, wherein causing the paste to pass through the apertures of the screen mask that are located over the raised portion, without causing the paste to pass through apertures of the screen mask that are located over the recessed portion comprises applying pressure that presses the paste though the apertures.

11. The method according to claim 8, wherein the semiconductor dies are first semiconductor dies, the method further comprising securing second semiconductor dies to the first semiconductor dies, respectively, using the paste.

12. The method according to claim 11, wherein the first semiconductor dies integrates a MEMS device and the second semiconductor dies integrates an ASIC.

* * * * *